United States Patent [19]

Ohtomo

[11] 4,292,514
[45] Sep. 29, 1981

[54] APPARATUS FOR, AND METHOD FOR, ACHIEVING A TEMPERATURE COMPENSATION OF AN AVALANCHE PHOTODIODE

[75] Inventor: Fumio Ohtomo, Kawagoe, Japan

[73] Assignee: Tokyo Kogaku Kikai Kabushiki Kaisha, Tokyo, Japan

[21] Appl. No.: 94,555

[22] Filed: Nov. 15, 1979

[30] Foreign Application Priority Data

Nov. 20, 1978 [JP] Japan ................. 53-142208

[51] Int. Cl.³ .................................. H01J 40/14
[52] U.S. Cl. ........................... 250/214 C; 250/238
[58] Field of Search ............... 250/214 C, 214 R, 238

[56] References Cited

U.S. PATENT DOCUMENTS 3,644,740  2/1972  Dobratz et al. .

FOREIGN PATENT DOCUMENTS 51-54479 of 1976 Japan .

OTHER PUBLICATIONS

Sze, "Physics of Semiconductor Devices", Wiley-Intersciences, 1969 (New York).

Primary Examiner—David C. Nelms
Assistant Examiner—Darwin R. Hostetter
Attorney, Agent, or Firm—Bacon & Thomas

[57] ABSTRACT

An apparatus for, and a method for, achieving temperature compensation of an avalanche photodiode. The apparatus and method automatically detect the breakdown voltage of an avalanche photodiode immediately before the photodiode is operated and automatically applies the photodiode with a bias voltage always lower than the breakdown voltage of the photodiode, so that the multiplication factor of the photodiode is maintained constant.

4 Claims, 2 Drawing Figures

APPARATUS FOR, AND METHOD FOR, ACHIEVING A TEMPERATURE COMPENSATION OF AN AVALANCHE PHOTODIODE

BACKGROUND OF THE INVENTION

This invention relates to an apparatus for, and a method for, achieving temperature compensation for an avalanche photodiode used in a geodetic-distance meter or similar devices.

As well known, an avalanche photodiode, which is often used as a photosensitive element, has its multiplication factor varied according to the ambient temperature. In case an avalanche photodiode is used as a photosensitive element in, for example, a geodetic-distance meter, a bias voltage to be applied to the photodiode should be controlled according to the ambient temperature to prevent the multiplication factor from changing.

FIG. 1 is a block diagram of a known apparatus for achieving temperature compensation of an avalanche photodiode, thus showing also a known method therefor. As shown in FIG. 1, a voltage control circuit 1 is connected to a series circuit which is constituted by an avalanche photodiode PD and a load resistor R. The circuit 1 applies a predetermined bias voltage to the avalanche photodiode PD. The load resistor R is connected at one end to an amplifier 2, the output of which is connected to a signal filter 3. When the avalanche photodiode PD receives an input signal ray, it produces an output. The output of the photodiode PD is supplied to the amplifier 2 and the signal filter 3 and is taken out as a detection signal. A reference signal source 4 modulates an output of a light-emitting diode LED, using a reference signal having a frequency different from that of the detection signal, thereby obtaining a reference signal ray. The reference signal ray thus obtained is applied onto the avalanche photodiode PD. Upon receipt of the reference signal ray, the photodiode PD produces an output. This output of the photodiode PD is taken out through a reference signal filter 5, converted by a detector 6 into a DC voltage, and compared by a differential amplifier 7 with an output of a reference voltage source 8. The output of the differential amplifier 7 is supplied to the voltage control circuit 1, whereby the output voltage of the circuit 1, i.e. bias voltage of the photodiode PD is controlled.

If a negative feedback circuit is used to receive the reference signal ray, the output voltage of the detector 6 is equal to a reference voltage built up by the reference voltage source 8. In this case, the negative feedback circuit controls the bias voltage of the photodiode PD in such a manner as to maintain the multiplication factor of the photodiode PD unchanged, even if the ambient temperature changes.

The apparatus and method shown in FIG. 1, however, has some drawbacks. First, a temperature compensation should be conducted also on the light-emitting diode LED in order to achieve an accurate temperature compensation of the avalanche photodiode PD, for the output level of the light-emitting diode LED varies according to the ambient temperature, too. Second, the signal-to-noise (S/N) ratio of the detection signal often become poor since the reference signal ray is applied onto the avalanche photodiode PD while the photodiode is receiving the input signal ray. This is because, the more light it receives, the more noise an avalanche photodiode produces. Such deterioration of the S/N ratio of the detection signal is unavoidable in the apparatus of FIG. 1. The reference signal ray must be far more intense than the input signal ray because an input signal ray of, for example, a geodetic-distance meter is very feeble and because the gain of the negative feedback circuit cannot be made large but to a limited extent lest the negative feedback circuit should become unstable.

SUMMARY OF THE INVENTION

An object of this invention is to provide an apparatus for, and a method for, achieving temperature compensation of an avalanche photodiode, which has a simple structure and can yet keep the multiplication factor of photodiode unchanged despite a variation of the ambient temperature, without deteriorating the S/N ratio of the output signal of the photodiode.

According to this invention there is provided an apparatus for achieving temperature compensation of an avalanche photodiode, comprising;

a voltage-generating circuit for applying bias voltage to the avalanche photodiode;

controlling means for controlling output voltage of said voltage-generating circuit; and holding means for holding the bias voltage which is applied to the photodiode when the breakdown of the avalanche photodiode occurs, in which said controlling means causes said voltage generating circuit to deliver bias voltage for causing breakdown in the photodiode immediately before the photodiode is operated, and causes said voltage-generating circuit to deliver output voltage, when said photodiode is operated, which is lower by a predetermined value than said bias voltage held by said holding means, so that, during the operation time, bias voltage lower by a predetermined value than the breakdown voltage of the photodiode is supplied to the photodiode.

In another aspect of this invention there is provided a method for achieving temperature compensation of an avalanche photodiode, comprising a step of elevating the reference voltage of the photodiode, thus causing breakdown in the photodiode immediately before the photodiode is operated; a step of bringing into a sampling state a sample-hold circuit for sampling and holding the breakdown voltage of the photodiode; a step of driving the photodiode with a constant current; a step of bringing the sample-hold circuit into a holding state; a step of lowering the reference voltage; and a step of supplying the photodiode with a bias voltage lower by a predetermined value than the breakdown voltage of the photodiode, thereby operating the photodiode.

DETAILED DESCRIPTION OF THE PREFERRED EMBODIMENT

Figure 1:
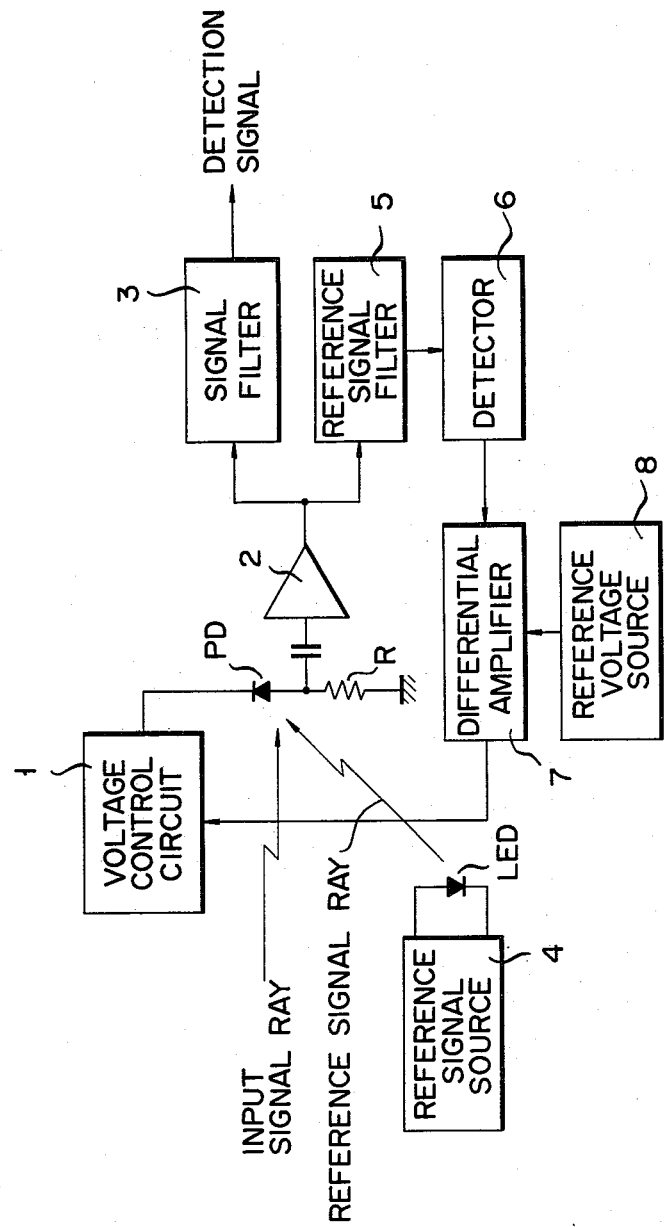
FIG. 1 is a block diagram of a conventional apparatus for achieving a temperature compensation of an avalanche photodiode, thus showing also a conventional method therefor.
Figure 2:
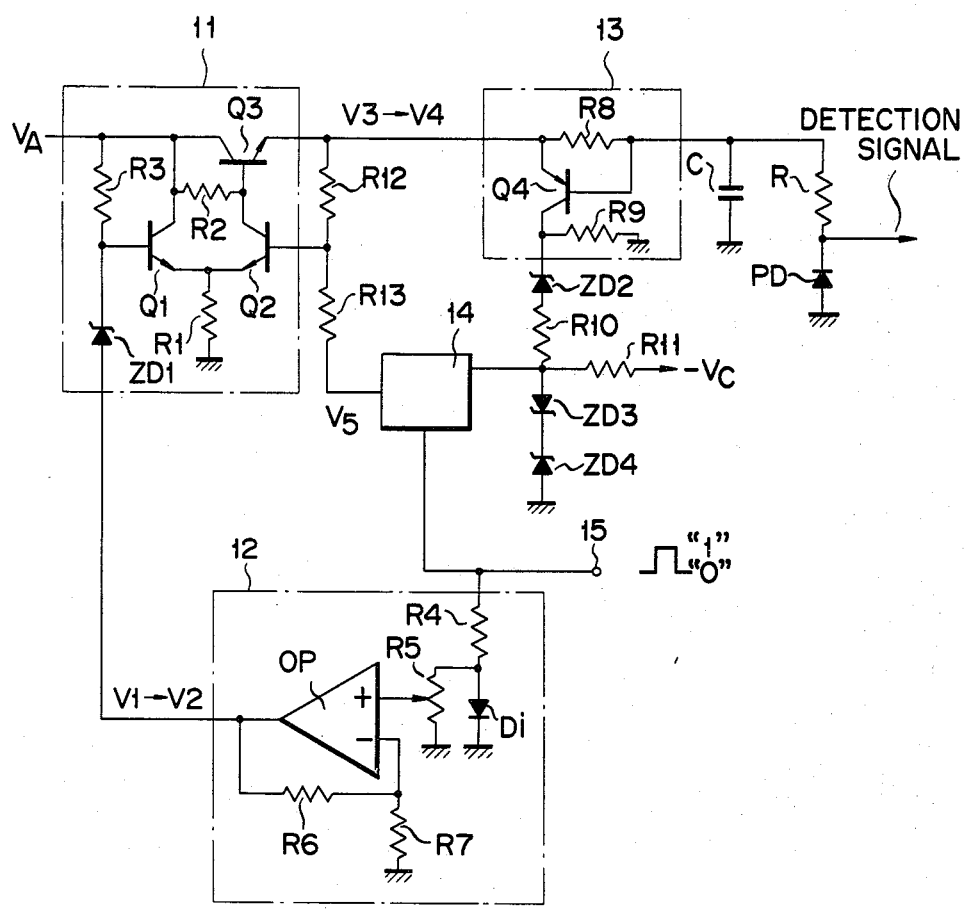
FIG. 2 is a circuit diagram of an embodiment of this invention.

As shown in FIG. 2, an apparatus according to this invention comprises a voltage-generating circuit 11, a gain-determining circuit 12, a current-detecting circuit 13, a sample-hold circuit 14 and a control terminal 15. The voltage-generating circuit 11 includes a differential amplifier which is constituted by transistors $Q_1$ and $Q_2$, a resistor $R_1$ constituting a part of a constant current circuit and a load resistor $R_2$ and a transistor $Q_3$ which is controlled by the output of the differential amplifier. One input terminal of the differential amplifier, i.e. the base of the transistor $Q_1$, is connected to a DC power source $V_A$ through a resistor $R_3$ and to the output terminal of the gain-determining circuit 12 through a Zener diode $ZD_1$. Thus, the voltage-generating circuit 11 receives the output voltage of the circuit 12 as a reference voltage and generates a predetermined output voltage at its output terminal, i.e. the emitter of the transistor $Q_3$. Under normal circumstances the gain-determining circuit 12 generates a reference voltage $V_2$. When it receives a timing pulse (logic level: 5 V) from the control terminal 15, the circuit 12 lower the level of the timing pulse to 0.7 V, using a series circuit constituted by a resistor $R_4$ and a diode $D_i$. The level of the timing pulse is changed to a predetermined value by a variable resistor $R_5$ and then supplied to an operational amplifier OP, whereby the circuit 12 generates a reference voltage $V_1$ which is higher than the reference voltage $V_2$. The values of the reference voltages $V_1$ and $V_2$ will later be described.

The output of the voltage-generating circuit 11 is supplied as a bias to a series circuit constituted by an avalanche photodiode PD and a load resistor R through the current-detecting circuit 13 which is constituted by a resistor $R_8$, a transistor $Q_4$ and a resistor $R_9$. A capacitor C is connected to the line connecting the circuit 13 and the resistor R and functions as a bypass for a detection signal.

The sample-hold circuit 14 is brought into sampling state upon receipt of a timing signal from the control terminal 15 and starts sampling the output of the current-detecting circuit 13. Upon lapse of the duration of the timing pulse, the circuit 14 is brought into holding stage. Between the input terminal of the sample hold circuit 14 and the output terminal of the current-detecting circuit 13, there are connected a Zener diode $ZD_2$ and a resistor $R_{10}$. The input terminal of the sample-hold circuit 14 is connected to a negative power source $-V_c$ via a resistor $R_{11}$. The Zener diode $ZD_2$, resistor $R_{10}$, resistor $R_{11}$ and negative power source $-V_c$ are provided to shift the level of an input signal of the sample-hold circuit 14, which operates from a positive to negative input voltage. Two Zener diodes $ZD_3$ and $ZD_4$ are serially connected to each other to limit the maximum amplitude of an input to the sample-hold circuit 14.

The output voltage of the sample-hold circuit 14 is supplied through a resistor $R_{13}$ and superposed on the output voltage of the voltage-generating circuit 11 which has been supplied through a resistor $R_{12}$. The sum of these voltages is supplied to another input terminal of the voltage-generating circuit 11, i.e. the base of the transistor $Q_2$.

Now it will be described how the apparatus shown in FIG. 2 to automatically achieve a temperature compensation of the avalanche photodiode PD.

Immediately before the avalanche photodiode PD starts operating, the bias voltage to the photodiode PD is adjusted in the following manner by supplying a timing pulse through the control terminal 15. Upon receipt of the timing pulse, the gain-determining circuit 12 generates the output voltage $V_1$. The voltage $V_1$ has such a value that the output voltage of the voltage-generating circuit 11 is higher than the breakdown voltage of the photodiode PD when the output voltage of the sample-hold circuit 14 is 0V. That is, when the output voltage of the circuit 14 is 0V, the output of the circuit 11 is a constant voltage which is based on the output voltage $V_1$ of the circuit 12 and which causes a breakdown in the photodiode PD. Once breakdown has occurred in the photodiode PD, the current-detecting circuit 13 starts operating to produce an output, which is supplied to the voltage-generating circuit 11 via the sample-hold circuit 14 and lowers the output voltage of the voltage-generating circuit 11. As a result, the current-detecting circuit functions as a constant current source, whereby the output voltages of the circuit 11 and the circuit 14 change to $V_3$ and $V_5$ respectively and never change thereafter. Upon lapse of the duration of the timing pulse, the sample-hold circuit 14 comes into holding state and thus maintains its output voltage $V_5$, and the output voltage of the gain-determining circuit 12 is lowered from $V_1$ to $V_2$. With its input reference voltage lowered in this way, the output voltage of the voltage-generating circuit 11 falls from $V_3$ to $V_4$. The output voltage $V_4$ of the circuit 11 may be made lower than the breakdown voltage of the avalanche photodiode PD merely by selecting a proper value for $(V_1 - V_2)$. This voltage $V_4$ is supplied to the avalanche photodiode PD as a bias voltage.

In this embodiment, $(V_1 - V_2)$ is a constant value, regardless of a variation of the breakdown voltage of the photodiode PD. Instead, this value may be changed according to the breakdown voltage of the photodiode PD, maintaining a specific ratio to thereto.

The output voltage $V_4$ of the circuit 11, or the bias voltage to the avalanche photodiode PD, keeps the multiplication factor of the photodiode PD constant and unchanged, for the following reason. Since the output voltage of the sample-hold circuit 14 is held at $V_5$, $(V_3 - V_4)$ corresponds to $(V_1 - V_2)$. The output voltage $V_3$ of the circuit 11 varies according to the breakdown voltage of the photodiode PD when the breakdown voltage changes according to the ambient temperature. Thus, a proper value for $(V_1 - V_2)$ is selected, the voltage $V_4$ or bias voltage is automatically made to be lower by a predetermined value than the breakdown voltage of the photodiode PD in case the breakdown voltage should change. Consequently, the multiplication factor of the avalanche photodiode PD is kept unchanged.

As mentioned above, according to the invention the breakdown voltage of an avalanche photodiode is detected without using a reference signal ray before the photodiode is operated, and a bias voltage lower by a predetermined value than the breakdown voltage of the photodiode is supplied to the photodiode so that the multiplication factor of the photodiode is maintained despite a variation of the ambient temperature. This temperature compensation helps an avalanche photodiode to produce a detection signal of an S/N ratio better than that of a detection signal obtained by the conventional temperature compensation apparatus and methods. Moreover, with this invention, which does not use a reference signal ray, it is unnecessary to conduct a temperature compensation of a reference signal ray source.

What is claimed is:

1. An apparatus for achieving temperature compensation of an avalanche photodiode, comprising:
   a voltage-generating circuit for applying bias voltage to the avalanche photodiode;

controlling means for controlling output voltage of said voltage-generating circuit; and holding means for holding bias voltage which is applied to the photodiode when the breakdown of the avalanche photodiode occurs, in which said controlling means causes said voltage-generating circuit to deliver the bias voltage for causing breakdown in the photodiode immediately before the photodiode is operated, and causes said voltage-generating circuit to deliver bias voltage, when said photodiode is operated, which is lower by a predetermined value than said bias voltage held by said holding means, so that, during the operation time, bias voltage lower by a predetermined value than the breakdown voltage of the photodiode is supplied to the photodiode.

2. An apparatus for achieving temperature compensation of an avalanche photodiode, comprising:

a voltage-generating circuit for applying bias voltage to an avalanche photodiode;

controlling means for controlling output voltage of said voltage-generating circuit;

a current detection circuit for detecting current flowing through the avalanche photodiode;

means for causing an output obtained when said current detection circuit detects current at the time of breakdown in the photodiode to be fed back to said voltage-generating circuit immediately before the operation of the photodiode to permit the photodiode to be driven with a constant current, and holding means for holding bias voltage supplied to the photodiode when the breakdown of the photodiode occurs with the constant current; in which said controlling means causes said voltage-generating circuit to deliver the bias voltage for causing the breakdown in the photodiode immediately before the photodiode is operated and causes said voltage-generating circuit to deliver output voltage, when the photodiode is operated, which is lower by a predetermined value than said bias voltage held by said holding mmeans, so that, during the operation time, bias voltage lower by the predetermined value than the breakdown voltage of the photodiode is supplied to the photodiode.

3. An apparatus for achieving temperature compensation of an avalanche photodiode, comprising a voltage-generating circuit output voltage of which is controlled by reference voltage; a current-detecting circuit for detecting the current flowing through said photodiode when said photodiode is biased by the output of said voltage-generating circuit; a sample-hold circuit for sampling and holding the output which is supplied, together with said reference voltage, to control said output voltage of said voltage-generating circuit; and means for controlling the output voltage of said voltage-generating circuit in accordance with the output of said sample-hold circuit, wherein breakdown is caused in said photodiode by elevating said reference voltage, said sample-hold circuit is brought into sampling state, thus operating said photodiode with a constant current, said sample-hold circuit is brought into holding state, and said reference voltage is lowered, whereby said photodiode is drive by bias voltage which is lower by a predetermined value than the breakdown voltage of said photodiode.

4. A method for achieving temperature compensation of an avalanche photodiode, comprising a step of elevating the reference voltage of the photodiode, thus causing breakdown in the photodiode immediately before the photodiode is operated; a step of bringing into a sampling state a sample-hold circuit for sampling and holding the breakdown voltage of the photodiode; a step of driving the photodiode with a constant current; a step of bringing the sample-hold circuit into a holding state; a step of lowering the reference voltage; and a step of supplying the photodiode with bias voltage lower by a predetermined value than the breakdown voltage of the photodiode, thereby operating the photodiode.

* * * * *